United States Patent
Srinvasa et al.

(10) Patent No.: US 7,522,085 B1
(45) Date of Patent: Apr. 21, 2009

(54) PIPELINED ANALOG TO DIGITAL CONVERTER WITHOUT INPUT SAMPLE/HOLD

(75) Inventors: Raghu N. Srinvasa, Bangalore (IN); Venkatesh T. Srinvasa Setty, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/926,176

(22) Filed: Oct. 29, 2007

(51) Int. Cl.
*H03M 1/38* (2006.01)

(52) U.S. Cl. ....................... 341/161; 341/155

(58) Field of Classification Search ............... 341/155, 341/161, 156
See application file for complete search history.

(56) References Cited

U.S. PATENT DOCUMENTS

| | | | |
|---|---|---|---|
| 6,396,429 B2 * | 5/2002 | Singer et al. | 341/155 |
| 6,710,735 B1 * | 3/2004 | Lin | 341/161 |
| 6,977,606 B2 * | 12/2005 | Daito | 341/161 |
| 7,187,318 B1 * | 3/2007 | Lee et al. | 341/161 |
| 2004/0217896 A1 * | 11/2004 | Cesura et al. | 341/161 |

* cited by examiner

*Primary Examiner*—Jean B Jeanglaude
(74) *Attorney, Agent, or Firm*—Steven A. Shaw; W. James Brady; Frederick J. Telecky, Jr.

(57) ABSTRACT

The first stage of a plurality of stages in a pipelined analog to digital converter couples its input analog signal to both a first and second sample and hold (S/H). The first S/H output is coupled to the input of a multiplying digital to analog converter (MDAC) of the first stage, and the second S/H output is coupled to a flash ADC of the first stage. The delay of the second S/H is longer than the delay of the first S/H, and the clock edge of the second S/H is delayed an adjustable amount with respect to the clock edge of the first S/H, so as to minimize the difference in held voltages at the outputs of the two S/Hs in the presence of an input signal having high slew rate. The residue voltage of the first stage is amplified in the MDAC by $2^{(n-2)}$ where n is the number of bits in the stage. The second stage flash ADC has a range of normal threshold voltage levels substantially half that of the first stage, and a plurality of added threshold voltage levels and corresponding comparators above and below the normal highest and lowest threshold voltages, thereby increasing dynamic range and providing over range and under range indications facilitating adjustment of the delay of the clock edge of the first stage second S/H.

10 Claims, 3 Drawing Sheets

PIPELINED ANALOG TO DIGITAL CONVERTER WITHOUT INPUT SAMPLE/HOLD

FIELD

Embodiments of the invention relate generally to analog to digital conversion, and more specifically to a multi-stage pipelined analog to digital converter (ADC) for conversion of high frequency signals, without the need for a sample and hold circuit preceding the first stage of the ADC.

BACKGROUND

Conversion of analog electrical signals to digital data is central to many electronic functions, for example to facilitate digital signal processing (DSP) of the digital data representing an input analog signal. In many cases, processing the signal in the digital domain provides greater accuracy, repeatability, and often lower system cost than analog processing.

Different types of analog to digital converters (ADC's) have been developed to efficiently convert a wide variety of analog signals. Some key attributes of an analog signal include frequency range, amplitude range, and desired signal to noise ratio. Different ADC's have been developed to address the wide differences in analog signals to be converted.

One class of ADC is known as a flash converter. Such a converter has typically $2^n$ comparators, each having a different threshold voltage applied to a first input, where the $2^n$ threshold voltages are substantially equally spread across a range from a lower reference voltage to a higher reference voltage. The input analog signal, which has a range substantially the same as the threshold voltage range, is coupled to the second input of all comparators. As the input analog voltage increases, progressively more comparators change state from low to high logic levels as the input analog voltage exceeds the threshold level of comparators. The resulting $2^n$ outputs of the comparators are sometimes referred to as thermometer code, due to the progressive nature of output change as input voltage rises. This thermometer code is then logically decoded to a binary representation of the input voltage. A primary advantage of the flash converter is its speed, since all comparators process the input concurrently, and the delay through the thermometer code to binary logic can be made quite small. The significant disadvantage of such a converter is the need for $2^n$ comparators. For example, a 4-bit conversion is accomplished with only 16 comparators, while a 9-bit conversion requires 512 comparators.

A class of ADC known as pipelined converter retains much of the speed advantage of the flash converter while dramatically reducing the number of comparators. In a pipelined ADC (PADC), the input analog signal is digitized in a first stage flash converter having a fraction of the desired total number of bits—for example, a 3-bit converter using eight comparators. The resulting 3-bit number is then a coarse estimate of the actual voltage. This 3-bit number is then input to a first stage multiplying digital to analog converter (MDAC), wherein it is accurately converted back to an analog voltage which is subtracted from the input analog signal. This difference voltage, which in the absence of error has one-eighth the peak to peak range of the input analog signal, is then multiplied by $2^n$ or, in this example, eight, yielding a residue voltage having substantially the same peak to peak range as the input analog signal. This amplified residue voltage is then coupled to the input of a second stage substantially identical to the first stage.

Because the residue voltage from the first stage has substantially the same dynamic range as the input to the first stage, the reference voltages of the second stage in this example are typically the same as those of the first stage. A second set of 3-bits is thus generated, as well as a second residue voltage, which is coupled to a third stage. The final stage of the PADC flash converts the residue voltage from the next-to-last stage to a desired number of bits, often the same number as the preceding stages. No MDAC is needed in the final stage since no residue voltage needs to be generated. In this manner, if each of three stages in this example PADC have 3-bit resolution, an input signal is converted to 9-bit resolution using a total of twenty-four comparators, rather than the $2^9$ comparators (512) that a pure flash ADC would need.

It is well known to those familiar with the art that many PADCs utilize a gain of $2^{(n-1)}$ rather than $2^n$ in the MDAC, providing additional dynamic range to facilitate error correction in succeeding stages. It is also well known that the number of bits resolved by each stage may differ. For example, a PADC may have 4-bit resolution in the first stage, and 3-bit resolution in succeeding stages.

The typical PADC stage has an analog sample/hold (S/H) ahead of the MDAC, and a second sample/hold ahead of the flash ADC. If the sampling times of these MDAC and flash ADC sample/holds differ while the input voltage is changing, an error known as dynamic offset is generated, causing an error in the residue voltage generated in the stage. To decrease this error, an additional input sample/hold circuit is typically placed ahead of the MDAC S/H and flash ADC S/H of the first stage. Because this input S/H typically stores the sampled voltage on a capacitor, the die size of an integrated circuit is increased by the relatively large area required by this capacitor. The input S/H also typically utilizes a buffer amplifier having a high input impedance to buffer the voltage on this capacitor from the following circuitry. The input dynamic range of this buffer amplifier is limited by the peak to peak supply voltage for the amplifier. A PADC operable without this input S/H and its associated buffer amplifier is therefore desirable, as it would reduce die area and allow a wider dynamic range at the input for a given power supply voltage.

SUMMARY

Embodiments of the invention provide a method and apparatus for a PADC operable without an input S/H or buffer amplifier. Optionally, the gain of the first stage residue voltage amplifier may be $(2^n)/4$ rather than the more typical $(2^n)/2$, in which case the threshold voltages in the second and subsequent stages are scaled downward from those of the first stage, thus facilitating operation of the PADC with a lower supply voltage for a given peak to peak signal swing.

Prior art PADCs employing error correction typically amplify the residue voltage of stage m by $(2^n)/2$, then couple this amplified residue voltage to an ADC in stage m+1 having the same reference voltages as the ADC in stage m. Because the input range at the stage m+1 ADC input is half that of the stage m ADC input, but the reference levels are the same in both stages, the nominal dynamic range at the stage m+1 input is twice that of the expected input signal. This additional headroom at the input of stage m+1 facilitates conversion without error even if the stage m+1 input is larger than it should be due to conversion errors in stage m.

In an embodiment of the invention described in greater detail below, the MDAC in the first stage of the PADC has an amplifier gain of $(2^n)/4$, rather than the $(2^n)/2$ as described above. The voltage swing of the residue voltage at the first stage output (second stage input) is thus typically only one-fourth the voltage swing of the first stage input. Additionally, the second stage of the PADC utilizes reference scaling, which reduces the reference voltages, and thus the threshold levels, of the second stage compared to the first. For an example case where the first stage residue voltage is amplified by $(2^n)/4$, the reference voltage range of the second stage is typically one-half the range of the first stage. In a novel embodiment of the present invention, one or more comparators are added which have threshold voltage levels above and below the prior highest and lowest threshold voltages, thereby increasing the dynamic range of the second stage input, and also providing data indicative of over or under range conditions.

The embodiment described herein has no S/H at the input of the first stage as is found in prior art PADC's. Rather, the input signal at the first stage is input to two S/H circuits substantially identical to those found in each subsequent stage. One S/H is ahead of the MDAC, and the second is ahead of the flash ADC. These two S/H circuits have differing delays, which leads to an undesired voltage differential at the two S/H outputs if they are sampled at substantially the same time. This difference is especially large when the input signal is rapidly changing. The embodiment described herein applies an additional, intentional delay to one of the S/H circuits so it is the slower of the two. The clock edge used for sampling this slower S/H is then delayed by an adjustable amount to compensate for the differing delays. The adjustment of this intentional clock edge delay is facilitated by examining the state of the outputs of the added comparators in stage two as described above, since large enough differences in the output voltages of the two S/H's will cause the amplified residual to exceed its nominal range.

As further described below, the disclosed embodiments provide a combination of desirable properties not available in the known art, including a reduction in die area due to the elimination of the common input S/H, as well as facilitating the operation of the circuitry on a lower supply voltage.

Further benefits and advantages will become apparent to those skilled in the art to which the invention relates.

DESCRIPTION OF THE VIEWS OF THE DRAWINGS

Throughout the drawings, like elements are referred to by like numerals.

DETAILED DESCRIPTION

Figure 1:
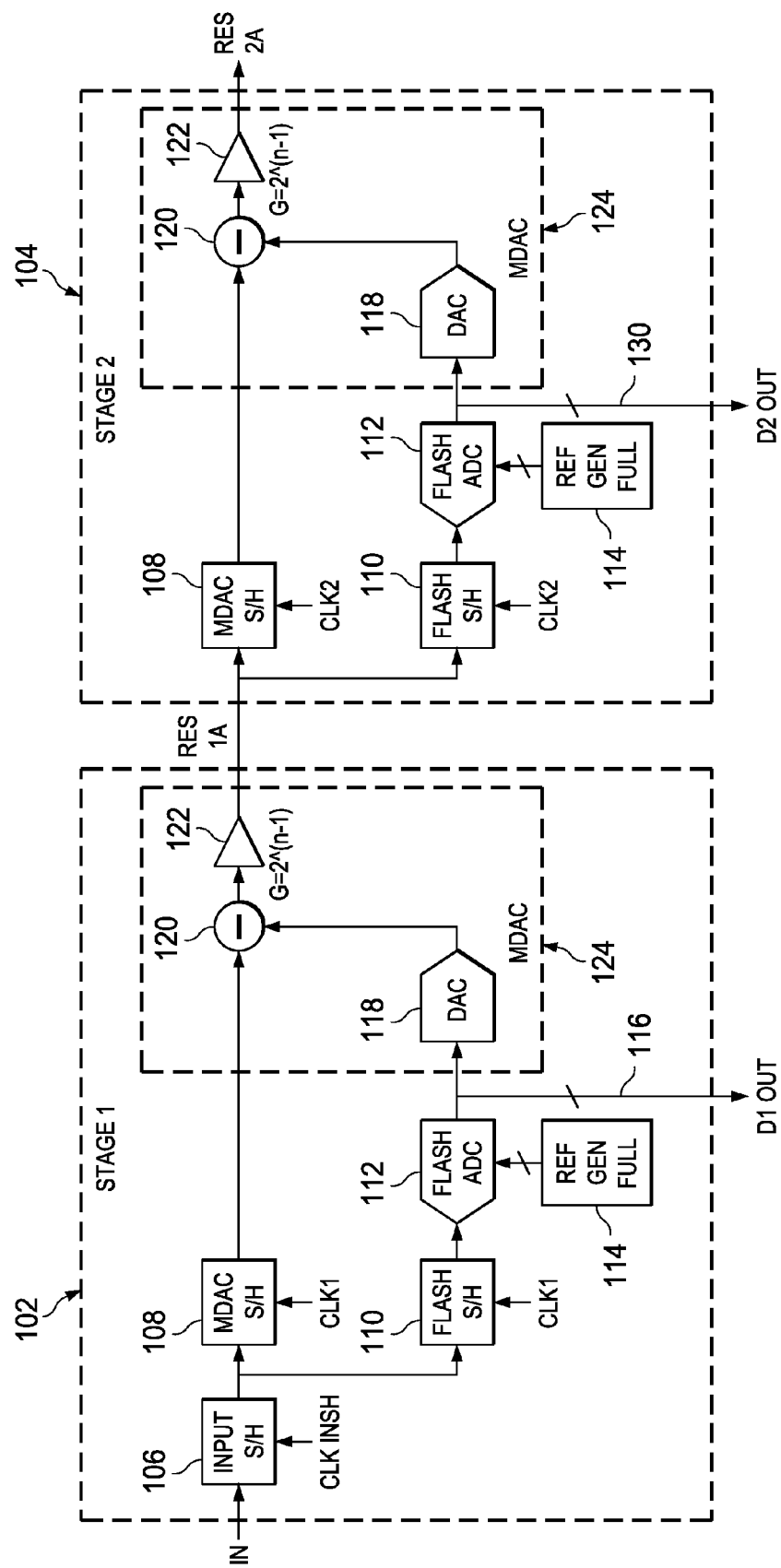
FIG. 1 (prior art) is a block diagram of the first two stages of a pipelined ADC having an input S/H, each stage quantizing n bits to generate n−1 bits of data, wherein the residue voltage of the first stage is multiplied by $2^{(n-1)}$.

In FIG. 1, a prior art pipelined ADC has first stage 102 and second stage 104. Additional stages are typical in such an ADC but, for clarity, are not shown here. First stage 102 has an input analog signal coupled to the input of INPUT S/H 106, which also has a clock input coupled to clock signal CLK INSH. The output of INPUT S/H 106 is coupled both to the input of MDAC S/H 108 and the input of FLASH S/H 110. The clock inputs of both these S/H 108 and S/H 110 are coupled to signal CLK1, which is typically at substantially the same frequency as CLK INSH but differing in phase to allow for delays from CLK INSH edge to valid output of INPUT S/H 106. The output of MDAC S/H 108 is coupled to the analog input of MDAC 124 (comprising subtractor 120, DAC 118, and amplifier 122) and hence to the first input of subtractor 120. The output of FLASH S/H 110 is coupled to the input of FLASH ADC 112. Reference voltage generator REF GEN FULL 114 generates a plurality of threshold voltages suitable for FLASH ADC 112. This plurality of threshold voltages from REF GEN FULL is coupled to a plurality of comparators in FLASH ADC 112. The output of FLASH ADC 112, a plurality of n digital bits, is coupled to data output D1 OUT 116 and to the digital input of MDAC 124, hence to the input of DAC 118. The output of DAC 118 is coupled to the second input of subtractor 120. The output of subtractor 120 is coupled to the input of amplifier 122 having a typical gain $G=2^{(n-1)}$, where n is the number of bits in FLASH ADC 112 and DAC 118. The resulting output of amplifier 122 is residue voltage RES 1A.

Residue voltage RES 1A is coupled to the input of stage two 104, hence to the inputs of MDAC S/H 108 and the input of FLASH S/H 110. The clock inputs of both these S/H 108 and S/H 110 are coupled to signal CLK2, typically at substantially the same frequency as CLK1 but differing in phase to allow for delays from CLK1 edge to valid output of RES 1A. The output of MDAC S/H 108 is coupled to the analog input of MDAC 124 (comprising subtractor 120, DAC 118, and amplifier 122) and hence to the first input of subtractor 120. The output of FLASH S/H 110 is coupled to the input of FLASH ADC 112. Reference voltage generator REF GEN FULL 114 generates a plurality of threshold voltages suitable for FLASH ADC 112. This plurality of threshold voltages from REF GEN FULL is coupled to a plurality of comparators in FLASH ADC 112. The output of FLASH ADC 112, a plurality of n digital bits, is coupled to data output D2 OUT 130 and to the digital input of MDAC 124, hence to the input of DAC 118. The output of DAC 118 is coupled to the second input of subtractor 120. The output of subtractor 120 is coupled to the input of amplifier 122 having a typical gain $G=2^{(n-1)}$, where n is the number of bits in FLASH ADC 112 and DAC 118. The resulting output of amplifier 122 is residue voltage RES 2A.

In operation, INPUT S/H 106 is clocked by CLK INSH at the overall ADC sampling rate, and holds the sampled analog voltage for the duration of the sampling period. After the sampling by INPUT S/H 106 and during the remainder of the sampling period, both MDAC S/H 108 and FLASH S/H 110 are clocked, typically by the same clock CLK1, thus sampling and holding the voltage output from INPUT S/H 106. In the typical PADC, the signal delay through MDAC S/H 108 and FLASH S/H 110 are unequal, but because they are both sampling a stable voltage held by INPUT S/H 106, this difference in delay has little impact on PADC accuracy.

The output of FLASH S/H 110 is then digitized to n bits in LASH ADC 112, which output is coupled both to the input of DAC 118 and the D1 OUT 116 terminals of the stage. The reference generator REF GEN FULL 114 typically generates $2^n$ equally-spaced threshold voltages which are coupled respectively to the first inputs of the $2^n$ comparators in FLASH ADC 112. The second inputs of all of these comparators are typically coupled to the voltage input to the FLASH ADC 112.

DAC 118 converts the n-bit output of FLASH ADC 112 to an analog voltage, which is then subtracted from the voltage out of MDAC S/H 108 in SUBTRACTOR 120. The output of SUBTRACTOR 120 is then amplified by a gain of $2^{(n-1)}$ in amplifier 122. Because the gain of amplifier 122 is $2^{(n-1)}$ rather than $2^n$, the residue voltage at its output RES 1A, in the absence of voltage offsets or other errors, has substantially one-half the peak to peak signal swing of the voltage input to stage 1. Since stage two has the same input dynamic range as stage 1, this reduced output swing from stage one facilitates digital error correction as is known in the art. When digital error correction is utilized, it is typical for the output D1 OUT 116 to be n−1 bits, rather than the full n bits resolved by FLASH ADC 112.

The residue voltage RES 1A output from stage one is coupled to the input of stage two. In stage two there is no INPUT S/H; rather the input voltage is coupled directly to the inputs of stage two MDAC S/H 108 and FLASH S/H 110. The elimination of the INPUT S/H is possible because in stages two and subsequent, the residue voltage input to the stage is stable, after propagation delays, for the duration of the sample period. Stage two then operates, in a manner substantially identical to operation of stage one, to generate the next n bits of data at output D2 OUT 130 and residue voltage RES 2A at the output of the residue voltage amplifier 122. Though not shown in this figure, RES 2A is typically coupled to the input of stage three and so forth, until the desired total number of bits have been resolved in the plurality of stages.

Figure 2:
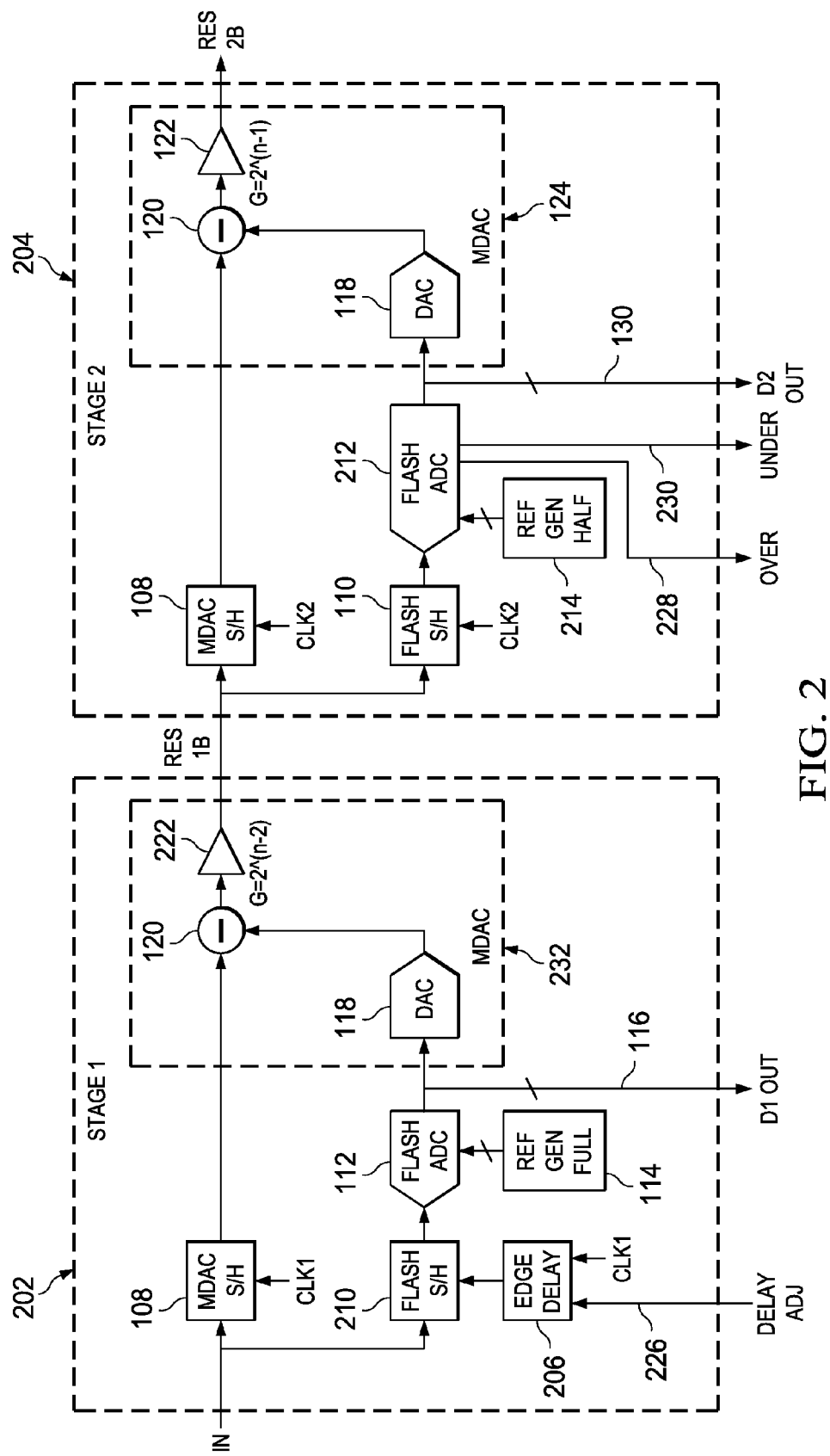
FIG. 2 is a block diagram of the first two stages of a pipelined ADC having no input S/H, with each stage quantizing n bits to generate n−1 bits of data, wherein the residue voltage of the first stage is multiplied by $2^{(n-2)}$, and wherein one of the two S/H circuits has more delay than the other and is clocked by an edge having an adjustable delay.

In FIG. 2, a novel configuration of the circuitry in stage one 202 of the PADC has the analog input to stage one coupled directly to the inputs of MDAC S/H 108 and FLASH S/H 210, with no intervening INPUT S/H as used in the prior art described in FIG. 1. A S/H clock signal CLK1 is coupled directly to MDAC S/H 108, and to the input of EDGE DELAY 206. The output of EDGE DELAY 206 is coupled to the clock input of FLASH S/H 210. Signal DELAY ADJ 226 is coupled to the delay adjust input of EDGE DELAY 206. The output of MDAC S/H 108 is coupled to the analog input of MDAC 232 and hence to a first input of subtractor 120. The output of FLASH S/H 210 is coupled to the input of FLASH ADC 112. Reference voltage generator REF GEN FULL 114 has its plurality of outputs, each having a threshold level suitable for FLASH ADC 112, coupled to FLASH ADC 112. The output of FLASH ADC 112, a plurality of n digital bits, is coupled to data output D1 OUT 116 and to the input of DAC 118. The output of DAC 118, the analog residue voltage for this first stage, is coupled to the second input of subtractor 120. The output of subtractor 120 is coupled to the input of amplifier 222 having a typical gain $G=2^{(n-2)}$, where n is the number of bits in FLASH ADC 112 and DAC 118. The resulting output of amplifier 222 is residue voltage RES 1B.

The output of stage one is coupled to the input of stage 2. In stage 2, the input voltage is coupled directly to the inputs of MDAC S/H 108 and FLASH S/H 110. A S/H clock signal CLK1 is coupled to MDAC S/H 108 and to the clock input of FLASH S/H 110. The output of MDAC S/H 108 is coupled to the analog input of MDAC 124 and hence to a first input of subtractor 120. The output of FLASH S/H 110 is coupled to the input of FLASH ADC 212. Reference voltage generator REF GEN HALF 214 has a plurality of outputs, each having a threshold level suitable for FLASH ADC 112 and typically half the voltage range of those thresholds generated by REF GEN FULL 114. The outputs from REF GEN HALF 214 are coupled to respective first inputs of a plurality of comparators in FLASH ADC 212. The input of FLASH ADC 212 is coupled to typically all of the second inputs of the same plurality of comparators. The output of FLASH ADC 212, a plurality of n digital bits, is coupled to data output D2 OUT 130 and to the input of DAC 118. The output of DAC 118 is coupled to the second input of subtractor 120. The output of subtractor 120 is coupled to the input of amplifier 122 having a typical gain $G=2^{(n-1)}$, where n is the number of bits in FLASH ADC 112 and DAC 118. The resulting output of amplifier 122 is residue voltage RES 2B. An additional comparator in FLASH ADC 212 has a first input coupled to a threshold voltage from REF GEN HALF 214 which is higher than the prior highest threshold, and a second input coupled to the input of FLASH ADC 212. The output of this comparator is coupled to OVER 228. Yet another additional comparator in FLASH ADC 212 has a first input coupled to a threshold voltage from REF GEN HALF 214 which is lower than the prior lowest threshold, and a second input coupled to the input of FLASH ADC 212. The output of this comparator is coupled to UNDER 230. Though not shown in this figure, RES 2B is typically coupled to the input of stage 3 and so forth.

In operation, MDAC S/H 108 is clocked by CLK1 at the overall ADC sampling rate, and holds the sampled analog voltage for the duration of the sampling period. FLASH S/H 210 has a delay intentionally larger by Td than the delay of MDAC S/H 108. EDGE DELAY 206 delays CLK1 by typically this time Td, plus or minus some adjustment range, and this delayed clock is used to clock the FLASH S/H 210. When the analog input to stage one has a high slew rate, the held outputs of MDAC S/H and FLASH S/H would differ if they were clocked by the same CLK1 as in the prior art, leading to dynamic accuracy error. By delaying the clock for FLASH S/H, the outputs of both MDAC S/H and FLASH S/H can be made nearly equal, thus compensating for the delay difference in these S/H stages and reducing significantly the dynamic error due to high slew rate input signals.

The output of FLASH S/H is then digitized to n bits in FLASH ADC 112, and is output both to the input of DAC 118 and the D1 OUT terminals of the stage. The reference generator REF GEN FULL typically generates $2^n$ equally-spaced voltages which are coupled respectively to the first inputs of the $2^n$ comparators in FLASH ADC 112. The second inputs of all of these comparators are typically coupled to the voltage input to the FLASH ADC.

DAC 118 converts the n-bit output of FLASH ADC 112 to an analog voltage, which is then subtracted from the voltage out of MDAC S/H 108 in SUBTRACTOR 120. The output of SUBTRACTOR 120 is then amplified by a gain of $2^{(n-2)}$ in amplifier 222. Because the gain of amplifier 222 is $2^{(n-2)}$ rather than the $2^{(n-1)}$ of the prior art PADC stage 1, the residue voltage at its output RES 1B, in the absence of voltage offsets or other errors, has one-quarter the peak to peak signal swing of the voltage input to stage 1. Since stage two has one-half the input dynamic range as stage one (as described below), this reduced output swing from stage one facilitates digital error correction as is known in the art, and because the reduced signal swing is half that of the prior art, the dynamic range of stage two and subsequent stages may be significantly less than the prior art, facilitating operation on a reduced supply voltage.

Figure 3:
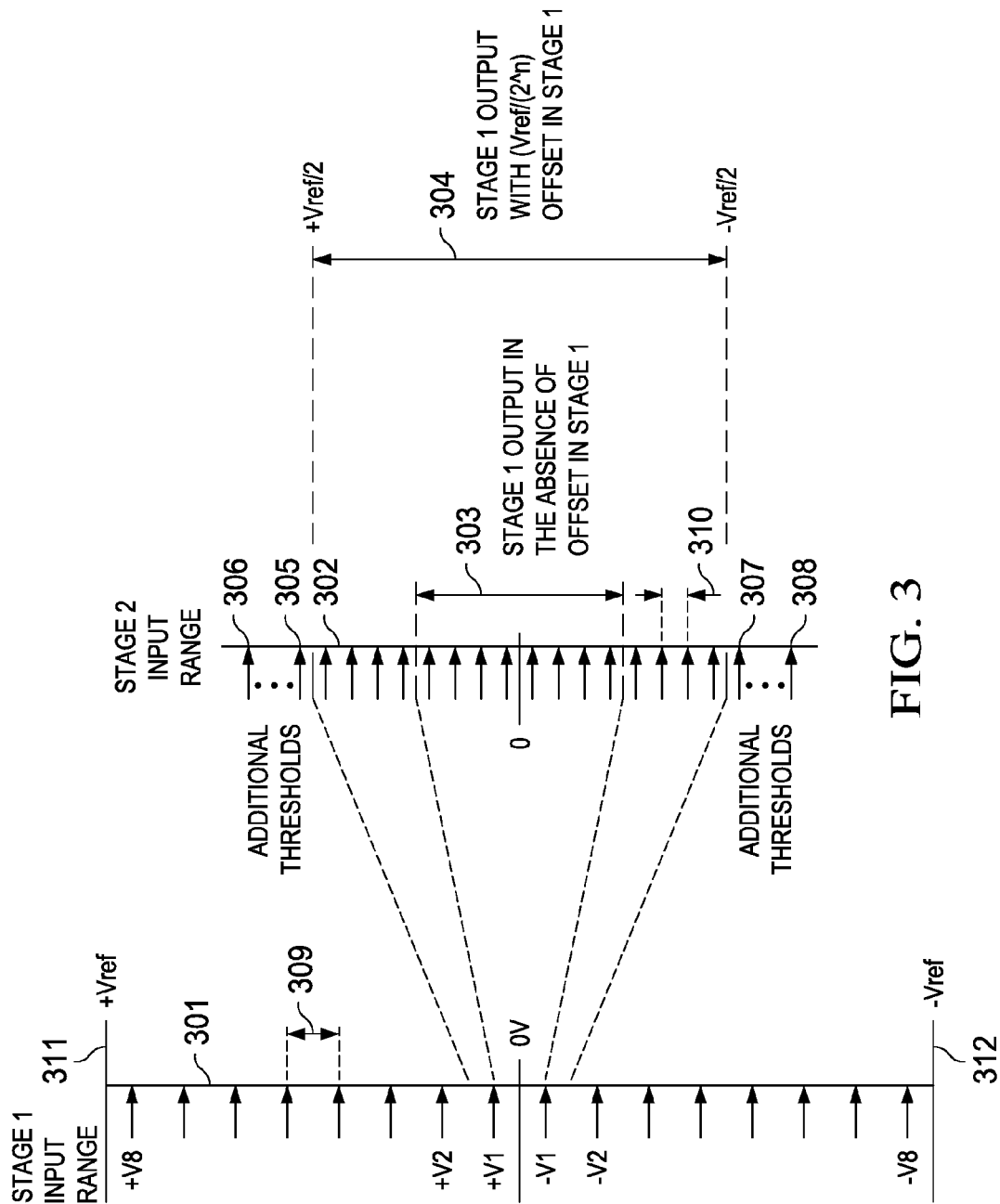
FIG. 3 shows the positive and negative reference levels and the intermediate threshold levels for the first and second stages of the pipelined ADC of FIG. 2, wherein the threshold levels of stage two are scaled downward from the levels of stage one, and wherein one or more stage two threshold levels are added to increase the input dynamic range of the second stage ADC.

The output of stage one is coupled to the input of stage 2. Because the signal swing from stage one is only half that of the prior art stage 1. is utilized in reference generator REF GEN HALF 214. In this manner, typically $2^n$ equally spaced reference voltages are generated, spanning half the voltage range of REF GEN FULL, as shown in FIG. 3. Stage two then operates in a manner analogous to stage one to generate the next n bits of data at output D2 OUT and residue voltage RES 2B at the output of the residue voltage amplifier. Note that residue voltage amplifier 122 of this stage has a gain G=2^(n−1), as do subsequent stages, so as to retain a dynamic range in stages two and subsequent stages of one-half that of stage 1. Though not shown in this figure, RES 2B is typically coupled to the input of stage 3 and so forth.

In this embodiment a plurality of additional voltage threshold levels are generated in REF GEN HALF 214, above and/or below what would have been the maximum and minimum threshold voltages respectively, as shown in FIG. 3. These added threshold voltages are coupled respectively to added comparators in FLASH ADC 212. The input dynamic range of stage two is thereby increased, allowing added error in RES 1B without saturating the FLASH ADC 212 of stage 2. Typical errors in RES 1B are due to offset or gain errors in the subcircuits in stage 1, or to dynamic errors caused by error in the delay compensation of the MDAC S/H and FLASH S/H of stage 1, as previously described. The additional comparators also provide outputs indicative of an under range or over range condition in FLASH ADC 212, which are coupled to OVER UNDER terminals 228 and 230 respectively. This OVER UNDER data facilitates adjusting EDGE DELAY 206, by modifying the signal at the DELAY ADJ 226 input while observing OVER UNDER until neither an over or under-range condition is present given a maximum slew rate signal at the input of stage one 202.

In FIG. 3, the sixteen threshold voltages of the first stage of a typical 4-bit flash ADC are graphically shown along vertical axis 301. There are eight positive threshold voltages, ranging between 0 and +Vref, denoted by V1 through V8, and eight negative threshold voltages, between 0 and −Vref, denoted by −V1 through −V8. The voltage difference between any two thresholds is typically (2*Vref)/16, as denoted by voltage span 309.

The threshold voltages of the second stage of the embodiment described above, utilizing reference scaling, are shown along vertical axis 302. There are eight positive threshold voltages, ranging between 0 and +Vref/2, denoted by V1/2 through V8/2, and eight negative threshold voltages, between 0 and −Vref/2, denoted by −V1/2 through −V8/2. The voltage difference between any two thresholds is typically (Vref)/16, as denoted by voltage span 310.

In the absence of offset or other error in stage 1, the residue voltage output from the residue voltage amplifier of stage 1, which has a gain of 2^(n−2) which in this example is 4, is graphically shown as voltage span 303. Span 303 occupies half the total stage two input range, thus allowing offset and other errors in the output of stage one without exceeding the input range of stage 2. A stage one output with Vref/(2^n) offset is shown as voltage span 304, which is still within the dynamic range of stage 2. Stage 2, even with reference scaling, thus has essentially the same margin for offset and gain errors as the prior art stage two without reference scaling, since the gain of the stage one residue voltage amplifier is halved when reference scaling is used.

The dynamic error introduced by the absence of an input sample/hold, even though reduced by the edge delay adjustment described above, adds to the total error which may be present at the output of stage 1. To provide additional dynamic range, in a novel manner a plurality of threshold voltages above Vref/2 are added as denoted by threshold 305 and 306, coupled to an equivalent number of added comparators. Similarly, a plurality of threshold voltages below −Vref/2 are added as denoted by threshold 307 and 308, also coupled to an equivalent number of added comparators.

The outputs of these added comparators provide data which is used in digital error correction. The output of the comparator coupled to added threshold voltage 305 provides an indication of an over range condition, when the stage two input exceeds +Vref/2. Similarly, the output of the comparator coupled to added threshold voltage 307 provides an indication of an under range condition, when the stage two input is less than −Vref/2. This over and under range data may be utilized to assist adjustment of EDGE DELAY 206.

It should also be understood that the use of Vdd, Vref, ground, etc., are illustrative only, and that implementations using single or dual power supplies and the like are equally possible. Moreover, reference voltages developed either internal to the circuit or external to the circuit will suffice.

Those skilled in the art to which the invention relates will appreciate that yet other substitutions and modifications can be made to the described embodiments, without departing from the spirit and scope of the invention as described by the claims below. For example, it is common in PADC design to have stages with differing number of bits of resolution. The delay compensation of multiple sample and holds having a common signal of high slew rate, as described in FIG. 2, may also be used in PADC circuits which do not utilize reference scaling or additional thresholds and comparators. Similarly, the additional thresholds and comparators may be used in PADC circuits which have input sample and hold circuits, and which may or may not use reference scaling. Many other alternatives to the circuits and sub circuits described are possible while retaining the scope and spirit of the invention.

What is claimed is:

1. An apparatus for reducing error at a plurality outputs of a plurality of sample and hold circuits having substantially a same input analog signal, when said input analog signal is changing with time, and when said plurality of sample and hold circuits have differing delays, comprising:
   a first sample and hold having a first delay, having said input analog signal as an input, and having a first clock signal;
   a next sample and hold having a next delay longer than said first delay, having same said input analog signal as an input, and having a second clock signal; and
   a clock edge delay circuit, having said first clock signal as an input, having a delay adjust signal input, and generating said second clock signal as an output whose delay with respect to said first clock signal input is responsive to said delay adjust signal, with said second clock signal output coupled to said second clock input of said next sample and hold;
   wherein the delay of said second clock signal is adjusted to compensate for the difference in delay between said first and next sample and holds, so as to cause the held outputs of both said sample and holds to be substantially equivalent even when said input analog signal is changing with time, thus minimizing dynamic error in said data output and said analog residue voltage output.

2. The apparatus of claim 1, further comprising:
   a flash analog to digital converter having an input coupled to the output of said next sample and hold, and a digital output coupled both to a digital to analog converter and to data output terminals, whereby said digital output is indicative of a portion of a magnitude of said input analog signal;
   a subtractor having a first input coupled to the output of said digital to analog converter, a second input coupled to the output of said first sample and hold, and having an output indicative of the difference between said first and second subtractor inputs; and an amplifier having an input coupled to the output of said subtractor, having an analog residue voltage output, whereby said analog residue voltage output is indicative of the difference between the analog representation of said digital output, as output by said digital to analog converter, and said input analog signal;

wherein the delay of said second clock signal is adjusted to compensate for the difference in delay between said first and next sample and holds, so as to cause the held outputs of both said sample and holds to be substantially equivalent even when said input analog signal is changing with time, thus minimizing dynamic error in said data output and said analog residue voltage output.

3. The apparatus of claim 2, further comprising:

a next apparatus substantially equivalent to the apparatus described in claim 2, with said analog residue voltage output of the apparatus of claim 2 coupled to the analog signal input of said next apparatus;

wherein a next data output and a next analog residue voltage output are generated by said next apparatus, and whereby the combined data output provides a more accurate digital representation of the analog input signal coupled to the input of the apparatus described in claim 2.

4. The apparatus of claim 2, wherein:

the gain of said amplifier is substantially equivalent to $2^{(n-1)}$, where n is the number of bits at said data output; and wherein the maximum peak to peak value of said analog residual output is substantially equal to one-half the peak-to-peak amplitude of said input analog signal.

5. The apparatus of claim 2, wherein:

the gain of said amplifier is substantially equivalent to $2^{(n-2)}$, where n is the number of bits at said data output; and wherein the maximum peak to peak value of said analog residual output is substantially equal to one-fourth the peak-to-peak amplitude of said input analog signal.

6. An apparatus for increasing the dynamic range of the next stage of a multi-stage pipelined flash analog to digital converter, comprising:

an added threshold voltage having a voltage level outside the peak to peak range of the other threshold voltages; and an added comparator having a first input coupled to said added threshold voltage, a second input coupled to the analog residue voltage output of the prior stage, and an output indicative of an out of range condition;

wherein it may be determined, by examining the output of said added comparator, whether an analog residue voltage signal outside the range of said other threshold voltages is also outside the wider range provided by the added threshold and comparator.

7. An apparatus for converting an input analog voltage to digital data, comprising:

a first stage comprising:

a first sample and hold having a first delay, having said input analog signal as an input, and having a first clock signal;

a next sample and hold having a next delay longer than said first delay, having same said input analog signal as an input, and having a second clock signal;

a clock edge delay circuit, having said first clock signal as an input, having a delay adjust signal input, and generating said second clock signal output whose delay with respect to said first clock signal input is responsive to said delay adjust signal, with said second clock signal output coupled to said second clock input of said next sample and hold;

a flash analog to digital converter having an input coupled to the output of said next sample and hold, having a threshold generator providing $2^n$ threshold voltages coupled to $2^n$ first inputs respectively of $2^n$ comparators, having $2^n$ second inputs coupled to said input, having outputs of $2^n$ comparators coupled to logic which decodes said $2^n$ comparator outputs to an n-bit digital output, said output being coupled to data output terminals and to the inputs of an n-bit digital to analog converter, whereby said digital output is indicative, to a first level of accuracy, of the magnitude of said input analog signal;

a subtractor having a first input coupled to the output of said digital to analog converter, a second input coupled to the output of said first sample and hold, and having an output indicative of the difference between said first and second subtractor inputs;

an amplifier with a gain of $2^{(n-2)}$ having an input coupled to the output of said subtractor, and having an analog residue voltage output, whereby said analog residue voltage output is indicative of the difference between the analog representation of said digital output, as output by said digital to analog converter, and said input analog signal;

wherein the delay of said second clock signal is adjusted to compensate for the difference in delay between said first and next sample and holds, so as to cause the held outputs of both said sample and holds to be substantially equivalent even when said input analog signal is changing with time, thus minimizing dynamic error in said data output and said analog residue voltage output;

a second stage comprising:

a first sample and hold having a first delay, having said input analog signal as an input, and having a first clock signal;

a next sample and hold having a next delay, having same said input analog signal as an input, and having same said first clock signal;

a flash analog to digital converter having an analog to digital converter (ADC) input coupled to the output of said next sample and hold, having $2^{(n-1)}+2$ threshold voltages having voltage differentials one to another substantially identical to those of the threshold voltages of the first stage, having said threshold voltages coupled to $2^{(n-1)}+2$ first inputs respectively of $2^{(n-1)}+2$ comparators, having $2^{(n-1)}+2$ second inputs coupled to said ADC input, having outputs of $2^{(n-1)}+2$ comparators coupled to logic which decodes said comparator outputs to an (n–1) bit digital output, said output being coupled to data output terminals and to the inputs of an (n–1)-bit digital to analog converter;

wherein said digital data, when appropriately added to the digital data of stage 1, is indicative, to a higher level of accuracy, of the magnitude of said input analog signal;

and wherein it may be determined, by examining the outputs of said added comparators, whether an analog residue voltage signal outside the range of said other threshold voltages is also outside the wider range provided by the added thresholds and comparators;

a subtractor having a first input coupled to the output of said digital to analog converter, a second input coupled to the output of said first sample and hold, and having an output indicative of the difference between said first and second subtractor inputs; and an amplifier with a gain of 2^(n−1) having an input coupled to the output of said subtractor, and having an analog residue voltage output, whereby said analog residue voltage output is indicative of the difference between the analog representation of said digital output, as output by said digital to analog converter, and said input analog signal;

wherein the delay adjust signal of stage one may be adjusted responsive to the state of the outputs of said added comparators of stage 2, such that the signal into stage two ADC stays within the dynamic range set by these added comparators and thresholds, so as to compensate for the delay difference between said first and second sample and hold circuits of stage one with a signal input to stage one having substantially the highest expected slew rate.

8. A method of minimizing dynamic error in the outputs of a plurality of sample and holds having differing delays, said method comprising:

coupling an input analog signal to the inputs of a first and next sample and hold, wherein said next sample and hold has more delay than said first sample and hold;

clocking said first sample and hold with a first clock; and clocking said next sample and hold with a delayed clock at some time t after said first sample and hold is clocked, wherein said delay t is substantially equal to the difference in delay of said first and next sample and hold circuits;

wherein the voltage held on the first sample and hold is substantially equal to the voltage held on the second sample and hold, even when said input analog signal is changing with time.

9. A method of increasing the dynamic range of a flash analog to digital converter (ADC), said method comprising:

generating new threshold voltages above and below the range of the set of existing threshold voltages, wherein said existing and new threshold voltages are coupled to first inputs of existing and new comparators respectively in the flash analog to digital converter (ADC), and wherein the second input of each of said comparators is coupled to the flash ADC input voltage;

comparing, in said new comparators, said input voltage with said new threshold voltages, whereby the logical output of said new comparator indicates whether said input voltage is above or below said new threshold voltages and thereby within or outside the high and low voltages set by the new threshold voltages;

logically examining the outputs of a plurality of comparator outputs to determine if said input voltage is within the high and low voltages set by the new threshold voltages;

generating an in-range signal if said logical examination indicates said input voltage is within the high and low voltages set by the new threshold voltages, else;

generating an out-of-range signal if said logical examination indicates said input voltage is outside the high and low voltages set by the new threshold voltages;

wherein an out-of-range condition shall indicate an error in conversion.

10. A method of converting an analog voltage to a digital value in a pipelined analog to digital converter (ADC), said method comprising:

coupling, in a first stage of said pipelined ADC, an input analog voltage to the inputs of a first and next sample and hold, wherein said next sample and hold has more delay than said first sample and hold;

clocking said first sample and hold with a first clock;

clocking said next sample and hold with a delayed clock at some time t after said first sample and hold is clocked, wherein said delay t is substantially equal to the difference in delay of said first and next sample and hold circuits;

wherein the voltage held at the output of the first sample and hold is substantially equal to the voltage held at the output of the second sample and hold, even when said input analog signal is changing with time;

converting, in a flash ADC in said first stage, the voltage held on the first sample and hold to a digital value;

coupling to output terminals said digital value;

converting said digital value to an analog voltage using a digital to analog converter (DAC);

subtracting said analog voltage from the voltage held on said second sample and hold, whereby a residue voltage is generated by said subtraction;

multiplying said residue voltage by a substantially fixed value to increase its level;

coupling the multiplied residue voltage from said first stage to a next stage;

generating, in said next stage, new flash ADC threshold voltages above and below the range of the set of existing threshold voltages, wherein said existing and new threshold voltages are coupled to first inputs of existing and new comparators respectively in the flash ADC, and wherein the second input of each of said comparators is coupled to the flash ADC input voltage which is the multiplied residue voltage from the first stage;

comparing, in said new comparators, said multiplied residue voltage from the first stage with said new threshold voltages, whereby the logical outputs of said new comparators indicate whether said multiplied residue voltage from the first stage is above or below said new threshold voltages and thereby within or outside the high and low voltages set by the new threshold voltages;

generating an in-range signal if said comparing step indicates said multiplied residue voltage from the first stage is within the high and low voltages set by the new threshold voltages, thereby indicating valid data, else;

generating an out-of-range signal if said comparing step indicates said multiplied residue voltage from the first stage is outside the high and low voltages set by the new threshold voltages, thereby indicating invalid data.

* * * * *